United States Patent
Shizukuishi

(10) Patent No.: US 9,484,387 B2
(45) Date of Patent: Nov. 1, 2016

(54) MANUFACTURING METHOD OF SEMICONDUCTOR DEVICE AND SEMICONDUCTOR DEVICE

(71) Applicant: Makoto Shizukuishi, Sendai (JP)

(72) Inventor: Makoto Shizukuishi, Sendai (JP)

( * ) Notice: Subject to any disclaimer, the term of this patent is extended or adjusted under 35 U.S.C. 154(b) by 0 days.

(21) Appl. No.: 14/437,445

(22) PCT Filed: Oct. 22, 2013

(86) PCT No.: PCT/JP2013/018579
§ 371 (c)(1),
(2) Date: Apr. 21, 2015

(87) PCT Pub. No.: WO2014/065278
PCT Pub. Date: May 1, 2014

(65) Prior Publication Data
US 2015/0279881 A1    Oct. 1, 2015

(30) Foreign Application Priority Data
Oct. 22, 2012  (JP) .................... 2012-232941

(51) Int. Cl.
*H01L 27/14*        (2006.01)
*H01L 27/146*       (2006.01)
(Continued)

(52) U.S. Cl.
CPC ..... *H01L 27/1469* (2013.01); *H01L 21/32133* (2013.01); *H01L 21/76871* (2013.01); *H01L 21/76883* (2013.01); *H01L 21/76898* (2013.01); *H01L 21/82* (2013.01); *H01L 23/481* (2013.01);
(Continued)

(58) Field of Classification Search
CPC ....................................................... H01L 23/60
See application file for complete search history.

(56) References Cited

U.S. PATENT DOCUMENTS 5,703,747 A    12/1997  Voldman et al.
6,448,661 B1 *  9/2002  Kim .................... H01L 23/481
                                                257/686
(Continued)

FOREIGN PATENT DOCUMENTS

JP    2000114531 A    4/2000
JP    2001326326 A   11/2001
JP    2010245506 A   10/2010

OTHER PUBLICATIONS

International Search Report PCT/ISA/210 for International Application No. PCT/JP2013/078579 Dated Feb. 18, 2014.

*Primary Examiner* — Mohammad Islam
*Assistant Examiner* — Ankush Singal
(74) *Attorney, Agent, or Firm* — Harness, Dickey & Pierce, P.L.C.

(57) ABSTRACT

A method of manufacturing a stacked semiconductor device having two or more wafers may include forming a conductor on an upper wafer, the conductor configured to electrically connect input terminals together that have no input protection circuit against ESD; forming front side micro-bumps on a front side of the upper wafer, the front side micro-bumps configured to electrically connect to back side micro-bumps on the upper wafer; forming a TSV structure, the TSV structure configured to facilitate electrical connections between the front and the back side of the upper wafer; forming back side micro-bumps on the back side of the upper wafer, the back side micro-bumps configured to electrically connect with front side micro-bumps on the lower wafer; stacking the upper wafer on the lower wafer; and separating the conductor such that each of the input terminals are electrically independent from other ones of the input terminals.

10 Claims, 14 Drawing Sheets

(51) Int. Cl.
  *H01L 27/02* (2006.01)
  *H01L 23/48* (2006.01)
  *H01L 23/60* (2006.01)
  *H01L 25/065* (2006.01)
  *H01L 25/00* (2006.01)
  *H01L 21/3213* (2006.01)
  *H01L 21/768* (2006.01)
  *H01L 21/82* (2006.01)

(52) U.S. Cl.
  CPC ........... *H01L 23/60* (2013.01); *H01L 25/0657* (2013.01); *H01L 25/50* (2013.01); *H01L 27/0296* (2013.01); *H01L 27/1464* (2013.01); *H01L 27/14634* (2013.01); *H01L 27/14636* (2013.01); *H01L 2224/16145* (2013.01); *H01L 2225/06513* (2013.01); *H01L 2225/06527* (2013.01); *H01L 2225/06544* (2013.01)

(56) References Cited

U.S. PATENT DOCUMENTS

| | | | |
|---|---|---|---|
| 8,080,862 B2 | 12/2011 | Kaskoun et al. | |
| 8,378,500 B2* | 2/2013 | Choi | H01L 24/14 257/738 |
| 8,492,905 B2* | 7/2013 | Suh | G11C 5/00 257/777 |
| 9,184,130 B2* | 11/2015 | Henderson | H01L 23/5256 |
| 2001/0005059 A1 | 6/2001 | Koyanagi et al. | |
| 2005/0141166 A1* | 6/2005 | Katsumura | H01C 7/1006 361/118 |
| 2009/0283898 A1* | 11/2009 | Janzen | H01L 21/76898 257/698 |
| 2010/0059869 A1* | 3/2010 | Kaskoun | H01L 21/76898 257/665 |
| 2010/0193959 A1* | 8/2010 | Grygiel | H01L 23/49833 257/773 |
| 2010/0225347 A1* | 9/2010 | Worley | H01L 22/34 324/762.06 |
| 2011/0031598 A1* | 2/2011 | Lee | H01L 23/49827 257/686 |
| 2011/0079912 A1* | 4/2011 | Marcoux | H01L 23/481 257/773 |
| 2011/0121811 A1* | 5/2011 | Dennard | H01L 23/642 323/318 |
| 2011/0194326 A1* | 8/2011 | Nakanishi | G11C 5/02 365/51 |
| 2011/0304010 A1* | 12/2011 | Jiang | H01L 23/3677 257/528 |
| 2012/0056251 A1 | 3/2012 | Kudoh | |
| 2012/0068360 A1* | 3/2012 | Best | H01L 23/481 257/774 |
| 2012/0262198 A1 | 10/2012 | Riho | |
| 2012/0292757 A1* | 11/2012 | Mauder | H01L 23/481 257/698 |
| 2013/0009278 A1* | 1/2013 | Lee | H01L 23/5252 257/530 |
| 2013/0293292 A1* | 11/2013 | Droege | H01L 25/0657 327/565 |
| 2014/0240566 A1* | 8/2014 | Shizukuishi | H01L 27/1469 348/302 |
| 2015/0138897 A1* | 5/2015 | Stephens, Jr. | G11C 11/40615 365/189.05 |

* cited by examiner

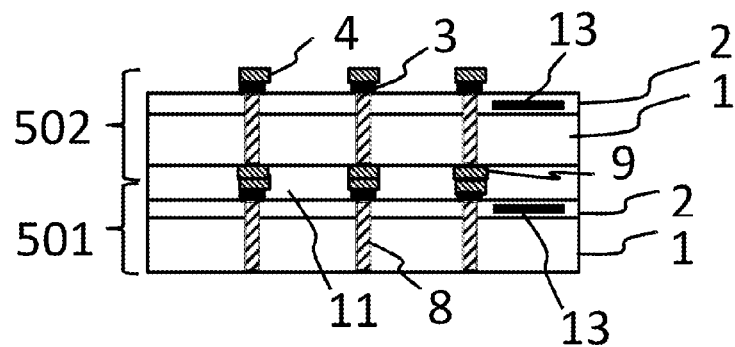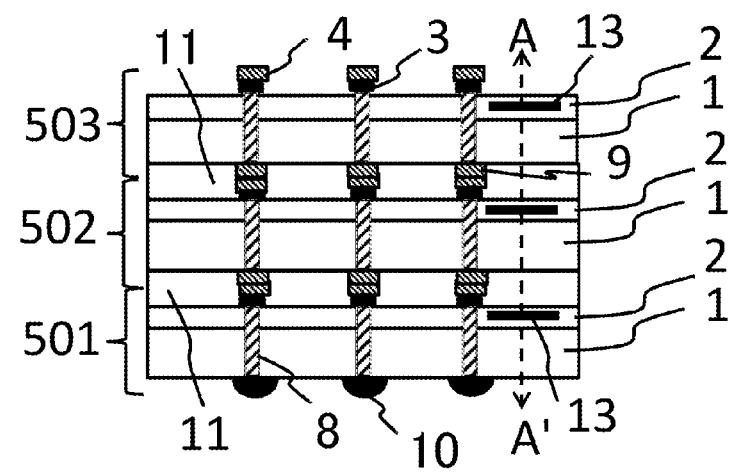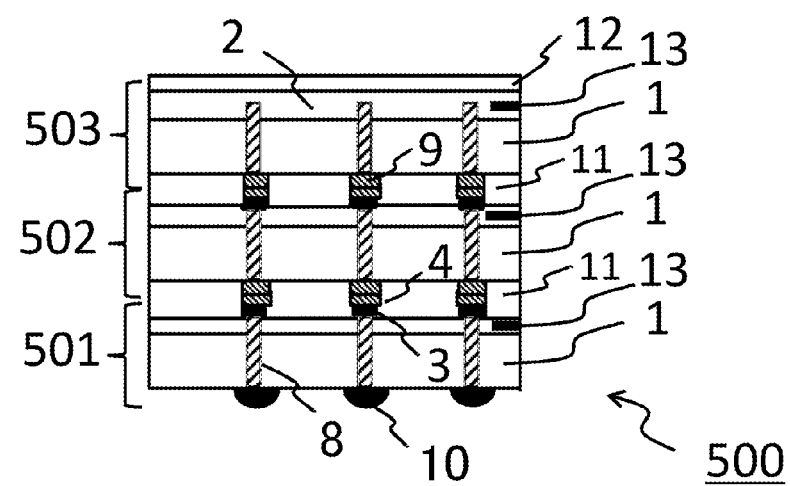

MANUFACTURING METHOD OF SEMICONDUCTOR DEVICE AND SEMICONDUCTOR DEVICE

PRIORITY STATEMENT

This application is the national phase application under 35 U.S.C. §371 of PCT International Application No. PCT/JP2013/078579 which has an International filing date of Oct. 22, 2013, which designated the United States of America, and which claims priority to Japanese patent application number JP 2012-232941 filed Oct. 22, 2012, the entire contents of each of which are hereby incorporated herein by reference.

1. TECHNICAL FIELD

Example embodiments relate to a method of manufacturing a semiconductor device and/or a semiconductor device.

2. RELATED ART

Semiconductor memory and logic devices have been highly integrated by miniaturizing their transistor sizes with fine MOS processing technologies. Recently, it becomes more difficult to realize further miniaturization of MOS planer transistors or memory cells, which may require an enormous amount of development cost for their research and development. Three dimensional or stacked structure semiconductor devices are becoming popular and may increase the total amount of MOS transistors and memory cells by stacking two or more chips. In addition, through silicon via (TSV) and a micro-bump technology, which enable electrical communication, not only between the front and the back side of the wafer, but also between the stacked wafers, have helped rapid progress on miniaturization and productivity of semiconductor devices.

FIG. 1a and FIG. 1b show a conventional stacked dynamic random access memory (DRAM).

Referring to FIG. 1a, FIG. 1a is a cross sectional view of the stacked DRAM. Two or more DRAM chips 17 are stacked on a system on chip (SoC) 20 which is mounted on an interposer or a circuit board 16. Both DRAM and SoC use a silicon substrate 1 on which electrical components, such as, transistors, and multi-layered electrical wirings 2 are formed on the surface of the silicon. By increasing the number of DRAM chips on the stacked DRAM, the memory capacity of the stacked DRAM can be increased without occupying a great deal of a print-circuit board space. The backside of the silicon substrate 1 is thinned to make it easy to have electrical connections between the front side and the back side of the DRAM. Through-silicon via (TSV) 8 connects the front side to the backside electrically. Micro-bumps 4 and 9 are formed on front sides and back sides of each chips, respectively. Micro-bumps are usually formed on a seed layer 3 to improve electrical conductivity between the different materials used for the micro-bumps and contact pads. In FIG. 1a, the micro-bump 4 has a seed layer 3. The micro-bump 9 may have a seed layer 3, if necessary, but not shown in the figure. Each chip is stacked by the adhesive layer 11, and electrical connections between the chips are enabled by contacting the micro-bumps 4 and 9. These stacked chips are over coated by a protective layer 12. The interposer 16, in this case, has solder-bumps 10 on its back side in order to make electrical contacts with external devices or wirings on a mounted circuit board.

Stacking the DRAM chips with the TSV structure, lengths of electrical wirings between the chips can be shortened, which results a reduction of signal delay time or a load capacitance, and results a higher data transfer rate. In addition, comparing the conventional wire-bonding structure, the number of input and output terminals can be increased with the TSV structure. The data width of more than 32 bits, such as 512 bits, for example, can be integrated which may enable higher data transfer with a slower clock frequency or a lower power consumption.

Referring to FIG. 1.b, FIG. 1b is a plan view of the stacked DRAM 17. Memory cell array blocks 18, and input or output buffer circuits 19 including input protection circuits are formed on the silicon substrate. The memory cells and these buffer circuits are not formed on the TSV portion 8 where the silicon substrate is etched away and a conductive material is refilled as shown in FIG. 1a. The TSV can be placed not only on peripheral regions like a conventional wire-bonding structure but on inside regions of the chip as shown in FIG. 1b.

The stacked structure explained above can increase the memory and circuit density and/or the number of input and output buffers 19. The area occupied by these buffers 19 including input protection circuits, however, becomes relatively larger with increasing the number of input and output terminals.

FIG. 2a shows a conventional input protection circuit 21 configured to protect against the electro-static discharge (ESD) failures.

Referring to FIG. 2a, two p-n junction diodes D1, D2, and a resistor R are formed between the contact PAD and input buffer circuit 22. The two diodes will discharge electro-static charges from PAD to the power line (VDD) or the ground connections before the ESD failures will occur. The resistor R will limit a peak current through the diodes. Input terminals or PADs are exposed to their external environment such as a high electro-static field of more than several hundreds or thousands volts, for example, which will far exceed a breakdown voltage of the thin insulator like a silicon dioxide ($SiO_2$) layer formed under the MOS transistor gate electrode.

The number of input and output PADs can be increased using the TSV structure instead of the wire-bonding technology. However, the area occupied by input protection circuits will increase with increasing the number of input PADs, which may eventually limit memory capacity on the chip. Output buffers between the stacked devices may be smaller than those of external output terminals because electrical wiring lengths between the chips can be shortened as explained above. The input protection circuit 21, on the other hand, may not be able to be miniaturized in order to maintain its immunity against the ESD failures.

FIG. 2b is a plan view of that schematically illustrates an equivalent circuit diagram of a conventional bi-directional input and output buffer circuit.

Referring to FIG. 2b, external terminals or PADs may often be bi-directional by having both input buffer 22 and output buffer 23 functions to save the space for PADs. These bi-directional terminals or PADs also need the input protection circuit 21 between the PAD and the input buffer circuit 22. Temperature and moisture are carefully monitored and ESD risk is minimized inside the semiconductor fabrication facility, but it is still difficult to stop all ESD phenomena. High frequency or high voltage plasma processing used for a high etching rate machine and high speed mechanical wafer handling or polishing process, for example, may increase ESD risk.

To protect against ESD events, some TSV structures have an ESD protection device for absorbing large voltages resulting from ESD events. However, these TSV structures need a p-n junction around the TSV which will need additional manufacturing steps and more space between the TSVs on the chip. The TSV with a junction diode may have other problems like increases in p-n junction leakage current and in capacitive load along the signal line.

SUMMARY

As for the stacked device hereinafter, the bottom chip may be called as an interface chip which may communicate with other devices or circuits by external terminals or pads. Chips stacked on the interface chip, on the other hand, may not need such external terminals or pads. Chips on and above the interface chip may be called as inner chips which may not be exposed to outside or external environment, and may communicate only with its stacked neighboring chips. Each input terminal on the inner chips may contact electrically with each output terminal on the neighboring chips after stacking the inner chip on the neighboring chip. During each wafer or chip manufacturing process before stacking, however, input terminals on the inner chip or wafer, which are exposed to external environment, may have ESD failures if the input terminals have no input protection circuits.

According to the example embodiment, before the chip staking process, input terminals having no input protection circuits on an upper chip are kept under the same electrical voltage level by electrically conductive means. After the upper or inner chip being stacked on the lower chip or interface chip, these input terminals are electrically separated from each other by etching or cutting the said electrically conductive means. These input terminals can work independently and the circuits on the chip will work properly. Consequently, the input terminals having no input protection circuits may be covered or connected by conductive means, which may prevent ESD failures even before the upper chip being stacked on the lower chip. After stacking the upper chip on the lower chip, the input terminals on the upper chip are electrically connected with the output terminals on the lower chip. Then these terminals are sandwiched between two chips and are no longer exposed to the external environment nor ESD.

According to the example embodiment, a seed layer may be used as the conductive means under the micro-bumps to cover the input terminal having no input protection circuits on upper chip, which may keep these input terminals under the same electrical voltage level. Before etching the seed layer, the upper chip is stacked on the lower chip. After the stacking process, the seed layer is etched away except under the micro-bumps in order to separate each input terminals such that the input terminals are electrically independent. Consequently, the input terminals having no input protection circuits on the upper chip are protected against the ESD phenomena even before the chip stacking process owing to the seed layer covering the surface of the upper chip. With the method, neither additional process steps nor unique process tools to prevent ESD are required. After stacking the upper chip on the lower chip, the input terminal having no input protection circuits on the upper chip are connected with the output terminals on the lower chip face to face, which may prevent ESD failures on the upper chip because these terminals are sandwiched between two chips and are neither exposed to the external environment nor ESD.

According to the example embodiment, manufacturing method may further include forming a shunt wiring as the conductive means to electrically connect each input and output terminals with a power supply and a ground terminals. Then, an upper wafer where inner chips being formed is stacked on a lower wafer. Next, the stacked wafers are cut and the shunt wirings between the chips are separated such that the input terminals are electrically independent. With the method, the input terminals having no input protection circuits on the chip may be protected against the ESD even before the wafer stacking process. Neither additional process steps nor unique process tools to prevent ESD failures are required. After stacking the upper wafer on the lower wafer, the input terminal having no input protection circuits are connected with the output terminals on the other wafer face to face, and are not exposed to the external environment or ESD.

According to the example embodiment, the bottom chip is an inter face chip, where the input terminals connecting with the output terminals on the upper chip have no input protection circuits, and where the input terminals exposing to the external environment have input protection circuits. With this configuration, the area for the input protection circuits on the interface chip can be reduced, and ESD failures can be prevented before the chip stacking process and even after the production is completed.

According to the example embodiment, a shunt-wiring is patterned in a meanders pattern so as to bridge neighboring terminals and to cross the chip boundary with a single stroke. With the manufacturing method using the meander pattern, the shunt wiring may be cut and every terminal may be separated each other even when the actual dicing position is shifted from the original or normal scribe lines.

According to the example embodiment, the shunt-wiring is structured as multi-wiring layers. The first shunt-wiring structure is formed by patterning the nth metal layer (n is an integer equal or larger than one), for example. The second shunt-wiring structure, on the other hand, is formed by patterning the n+1 th metal layer, for example. With this configuration, the line space between the shunt wirings on the same metal layer can be widened using metal wirings of different metal layers, which will avoid short circuit troubles between the neighboring shunt wirings on the same hierarchical level, and may be useful for semiconductor devices with increasing their input and output terminals or the number of TSVs. Conventionally, increases in the number of terminals or shunt wirings, may result in electrical short-circuits due to metal residues or incomplete breaks of shunt wirings even after the wafer dicing process. In contrast, in one or more example embodiments, these risks can be decreased even when the actual dicing position is shifted from the normal scribe lines.

According to an example embodiment, the manufacturing method may include forming a shunt wiring on the top wafer, where the top chips are formed, and forming a seed layer under the micro-bumps which covers all over the input terminal having no input protection circuits on the surface of lower chips. After stacking the upper wafer on the lower wafer, the seed layer is etched away except under the micro-bumps. After stacking the top wafer, the stacked wafers are then cut, and the shunt wirings between the chips are separated such that the input terminals are electrically independent. Consequently, the input terminals having no input protection circuits on the top chip are protected against the ESD even before the wafer stacking process by the shunt wirings on the top chip. Neither additional process steps nor unique process tools to prevent ESD failures are required. As for the top wafer, it may not be necessary to form a seed layer and micro-bumps on the front surface of the top chip.

In addition, after stacking the top wafer on the lower wafer face to face, the input terminal on the top chip having no input protection circuits are connected with the output terminals on the lower chip face to face, and are not exposed to the external environment or ESD.

According to an example embodiment, the top chip may be an image sensor, on which the shunt-wirings are formed outside the image sensing area. With this configuration, in addition to the above advantages, the manufacturing method may include forming micro-lenses on the front surface of the top image sensor chip, which may not be compatible with the process steps of forming the seed layer and micro-bumps on the same surface.

According to an example embodiment, the top chip may be a back-side illuminated image sensor (BSI), where the upside down top chip is stacked on the lower chip and has no TSVs. Then, the shunt-wirings can be formed on the opposite surface to the surface having a micro-lenses formed thereon, regardless of the image sensing area. With this configuration, in addition to the above advantages, the manufacturing method may include forming the micro-lenses on the top surface of the image sensor chip, which may not be compatible with the process steps of forming the seed layer and micro-bumps on the same surface, and can increase the effective image sensing area on the top surface of the image sensor chip.

According to an example embodiment, manufacturing method may include forming a shunt wiring on the bottom wafer, where interface chips are formed, and forming a seed layer under the micro-bumps which covers all over the input terminal having no input protection circuits on the upper wafer, where upper chips are formed. After stacking the upper chip on the interface chip, the seed layer is etched away except under the micro-bumps. After stacking the top wafer, the stacked wafers are then cut, and as a result, the shunt wirings between the interface chips are separated as the input terminals being electrically independent. With the method, the input terminals having no input protection circuits on the interface chip are protected against the ESD even before the wafer stacking process by the shunt wirings on the bottom wafer. Neither additional process steps nor unique process tools to prevent ESD failures are required. After stacking the upper wafer on the bottom wafer face to face, the input terminal on the bottom chip having no input protection circuits are connected with the output terminals on the upper chip, and are not exposed to the external environment or ESD. In addition, without the input protection circuits on the front surface of the bottom chip, more circuits or memory cells can be integrated.

From FIG. 7a to FIG. 7h are cross sectional views that schematically outline a method for manufacturing process according to another example embodiment.

Figure 8A:
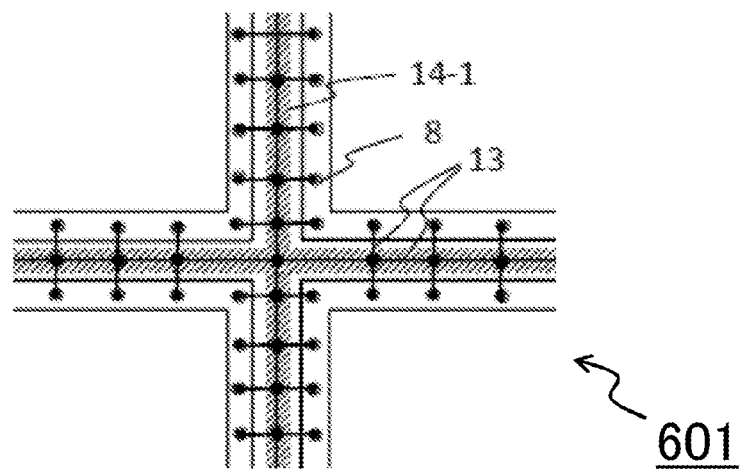
Figure 8B:
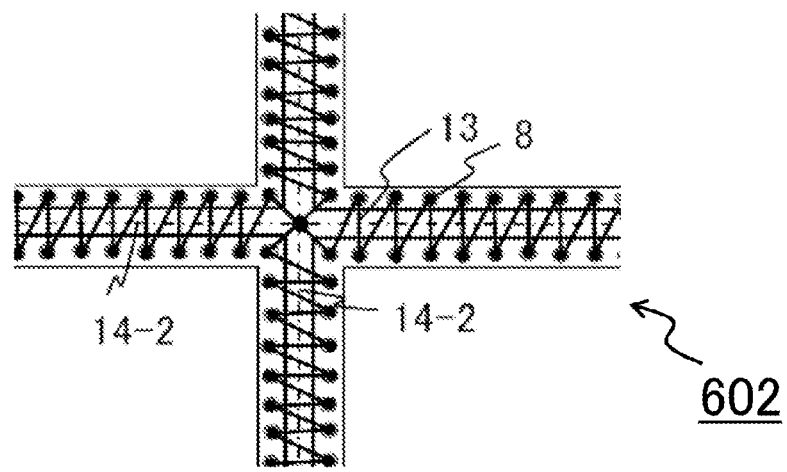
Figure 8C:
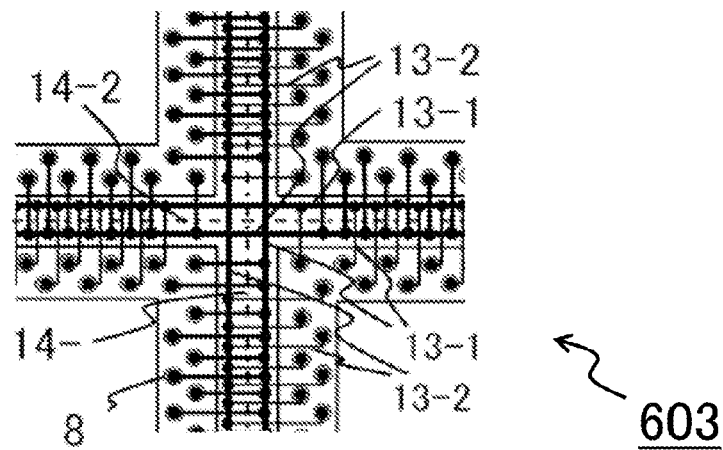

From FIG. 8a to FIG. 8c are plan views that schematically illustrate shunt wiring layouts on each wafer used by at least one example embodiment.

Figure 9A:
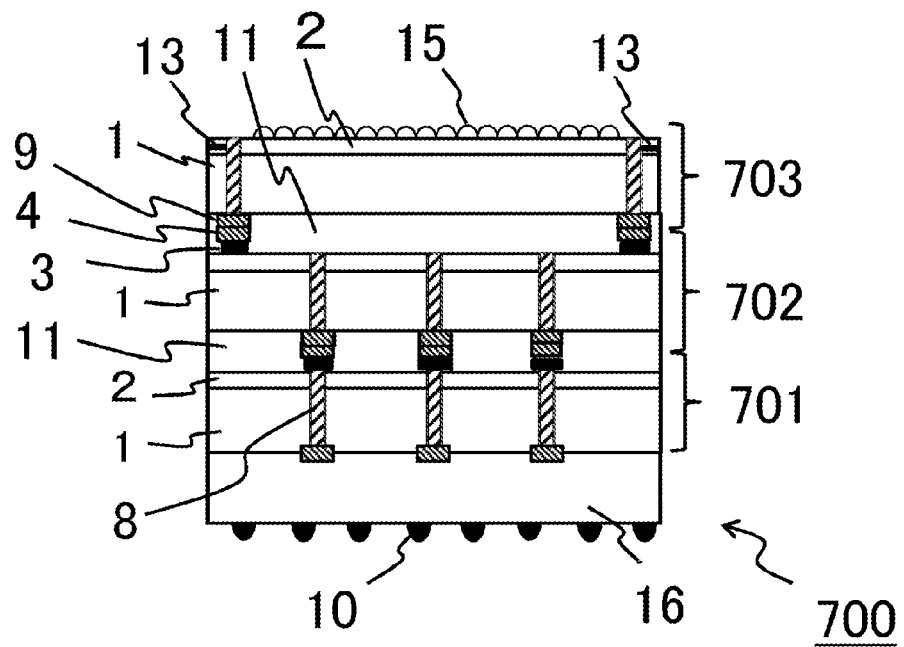

FIG. 9a is a cross sectional view that schematically illustrates a stacked image sensor obtained by a manufacturing method according to at least one example embodiment.

Figure 9B:
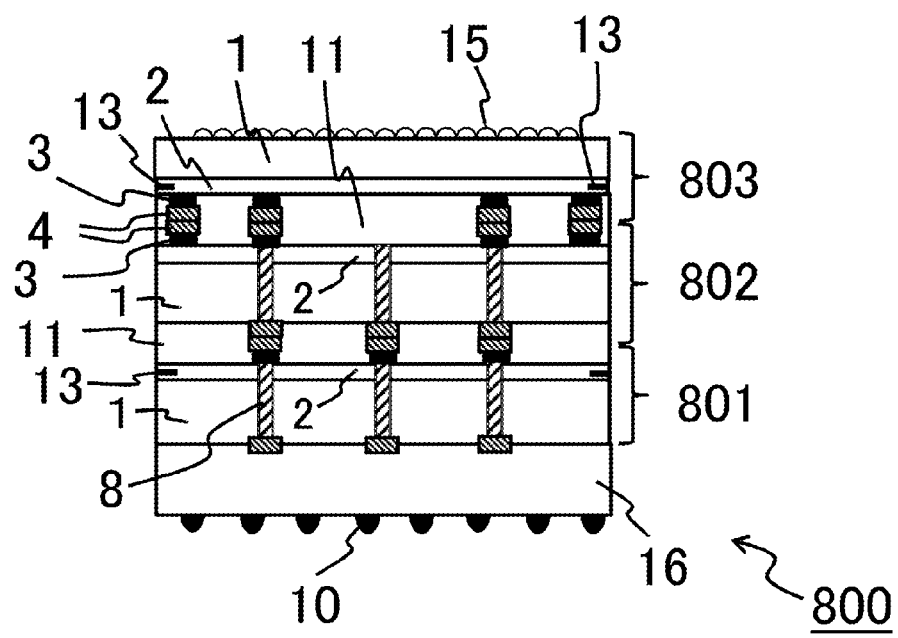

FIG. 9b is a cross sectional view that schematically illustrates another stacked image sensor obtained by a manufacturing method according to at least one example embodiment.

Figure 10:
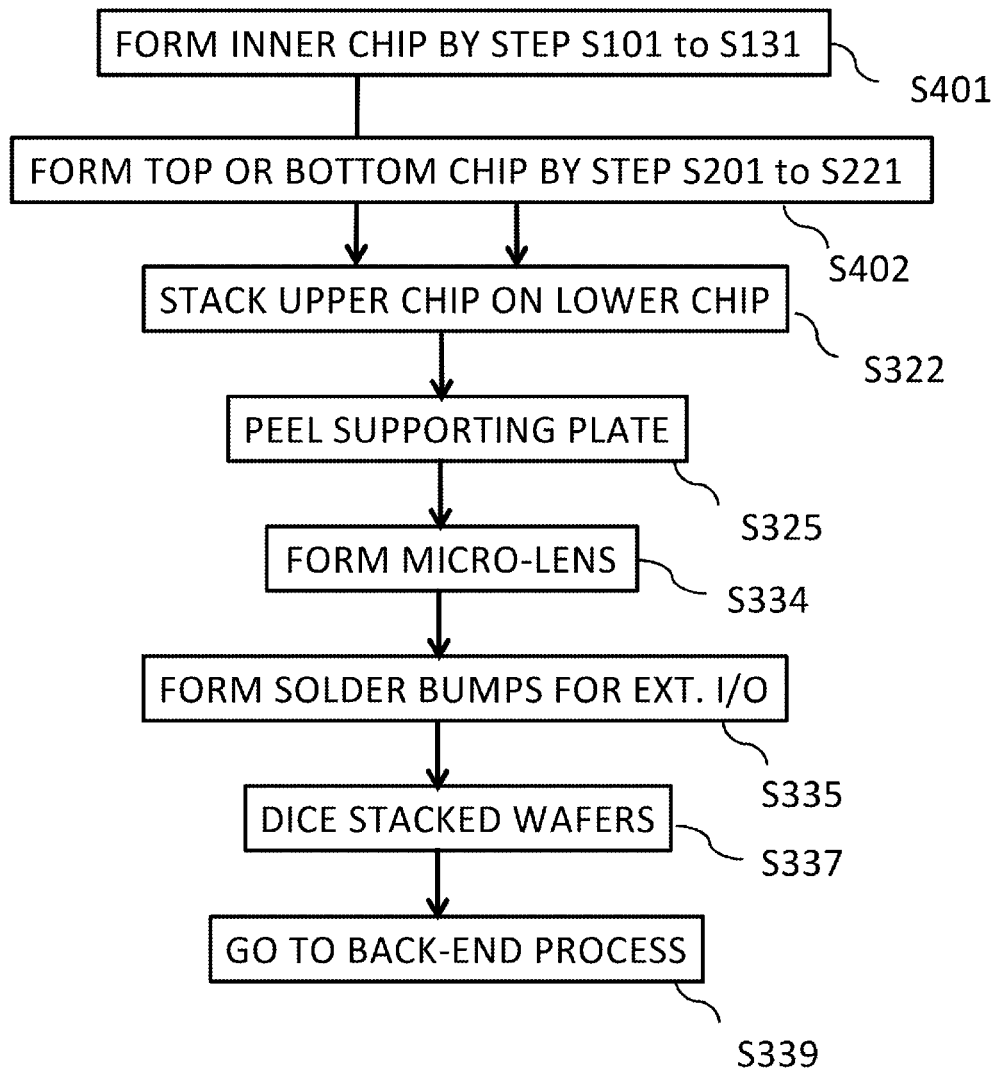

FIG. 10 is a flow chart outlining a method for manufacturing process according to yet another example embodiment.

DETAILED DESCRIPTION OF EXAMPLE EMBODIMENTS

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of the example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Various example embodiments will now be described more fully with reference to the accompanying drawings in which some example embodiments are shown. In the drawings, the thicknesses of layers and regions are exaggerated for clarity.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Figure 1A:
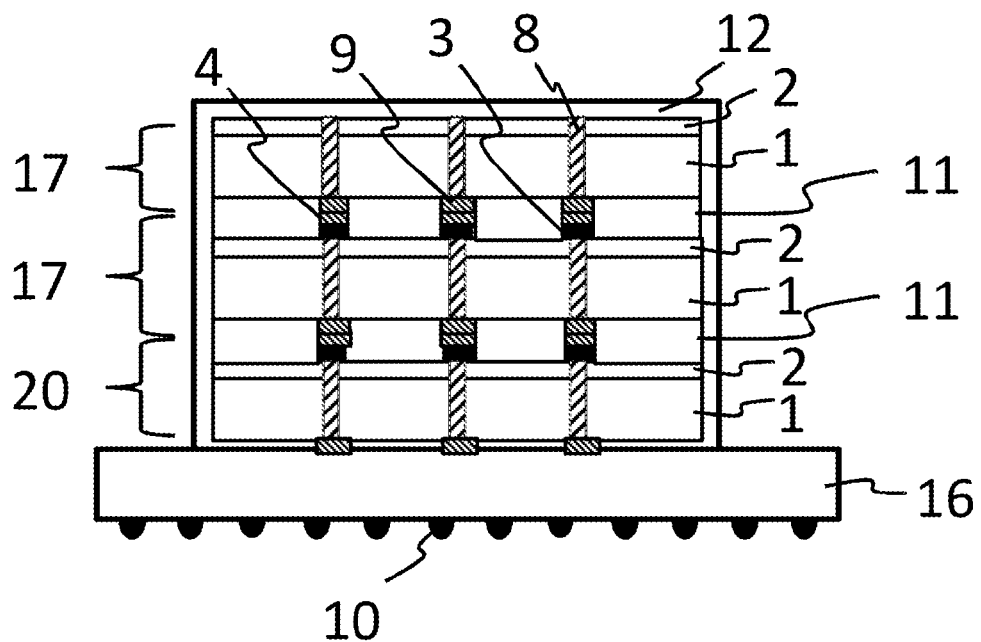
FIG. 1a is a cross sectional view of that schematically illustrates a conventional stacked DRAM.
Figure 1B:
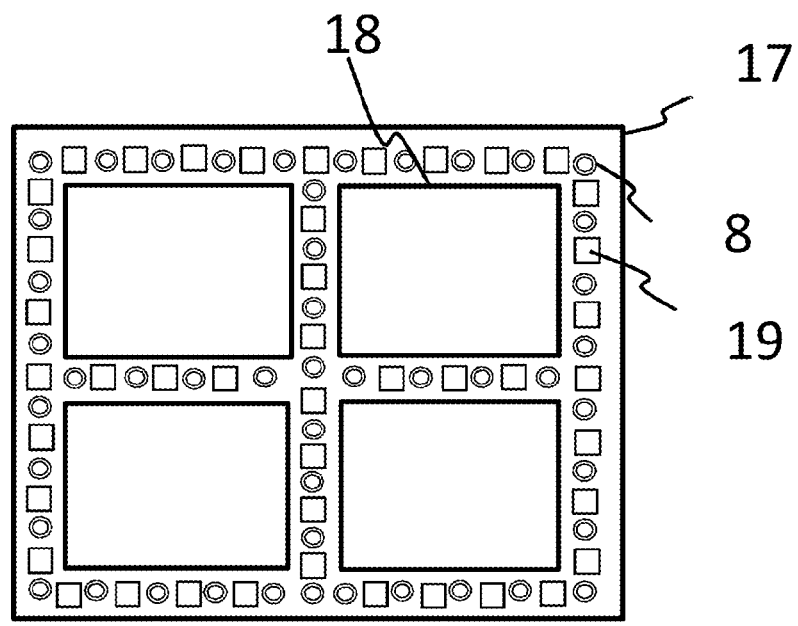
FIG. 1b is a plan view that schematically illustrates a conventional stacked DRAM.
Figure 2A:
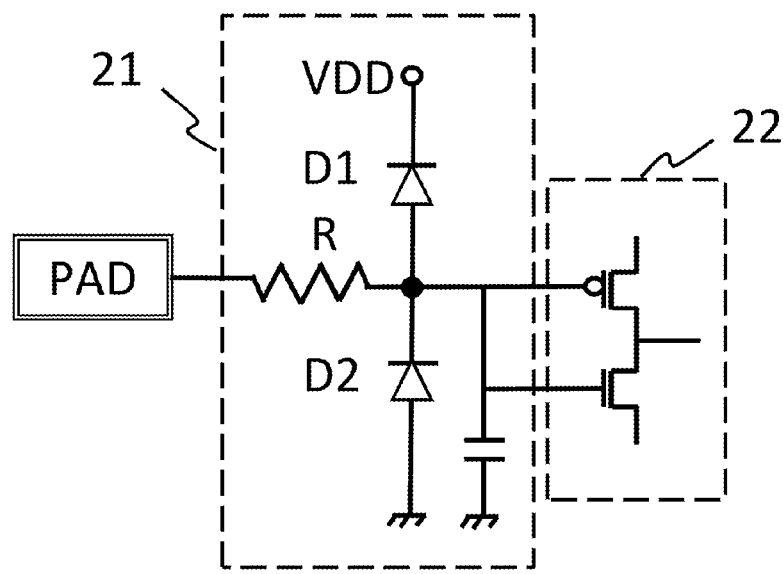
FIG. 2a is a plan view that schematically illustrates an equivalent circuit diagram of a conventional input protection circuit.
Figure 2B:
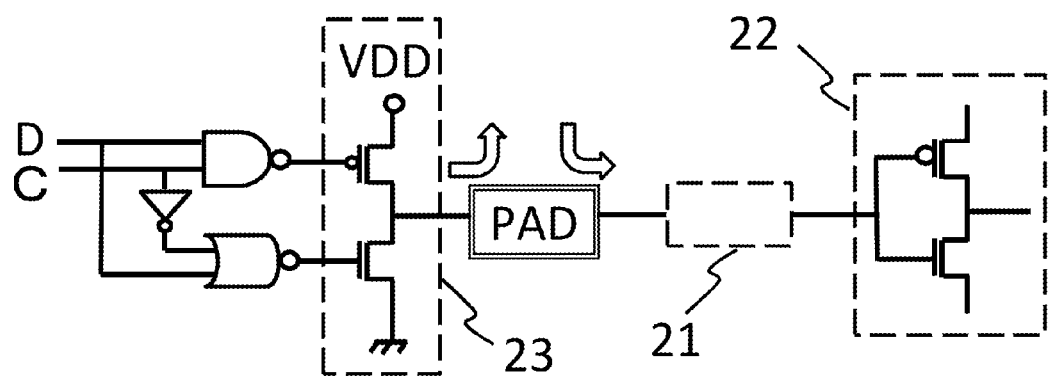
FIG. 2b is a plan view that schematically illustrates an equivalent circuit diagram of a conventional bi-directional input and output buffer circuit.
Figure 3A:
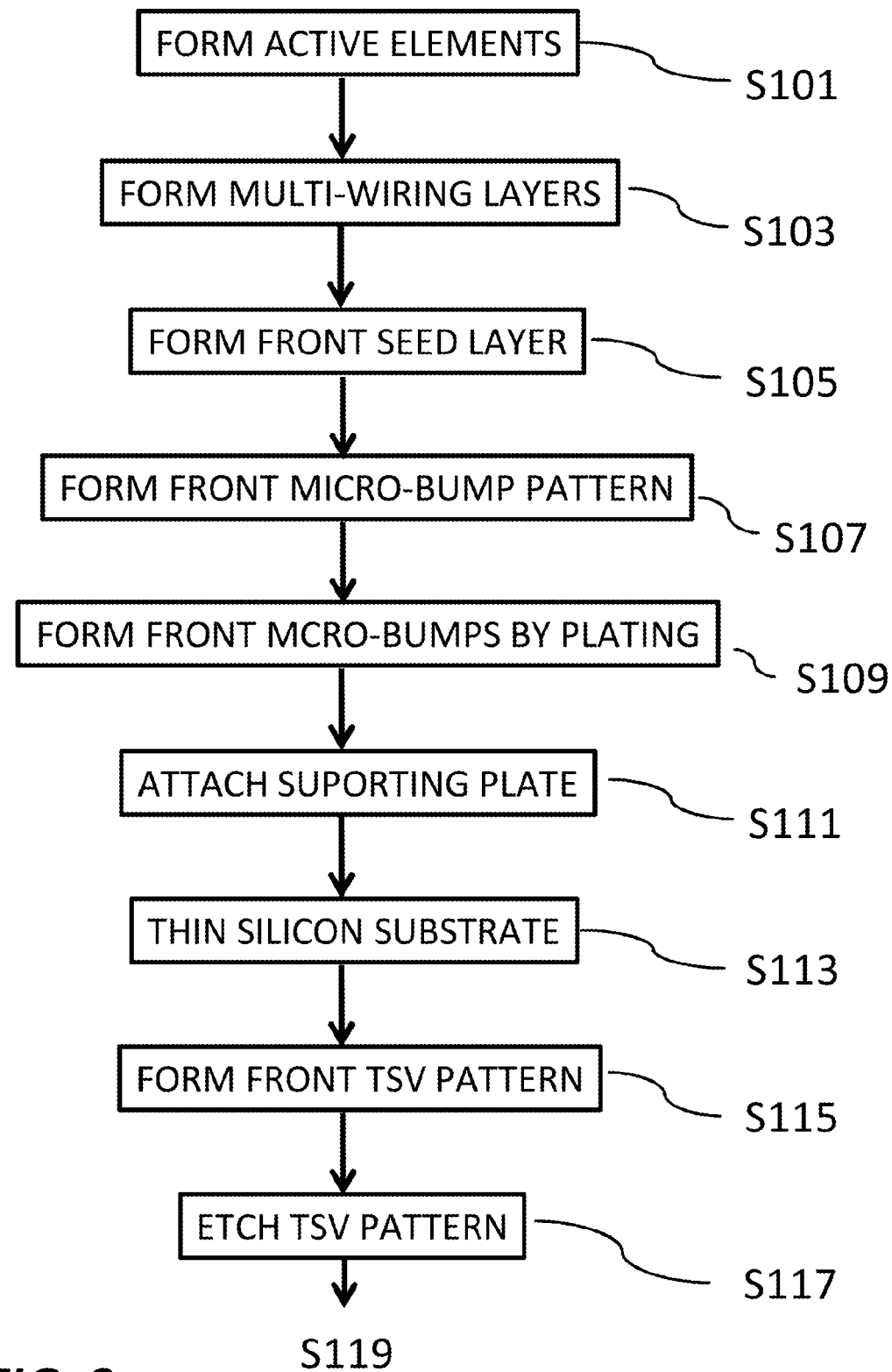
FIG. 3a and FIG. 3b are flow charts outlining a method for manufacturing process according to at least one example embodiment.
Figure 3B:
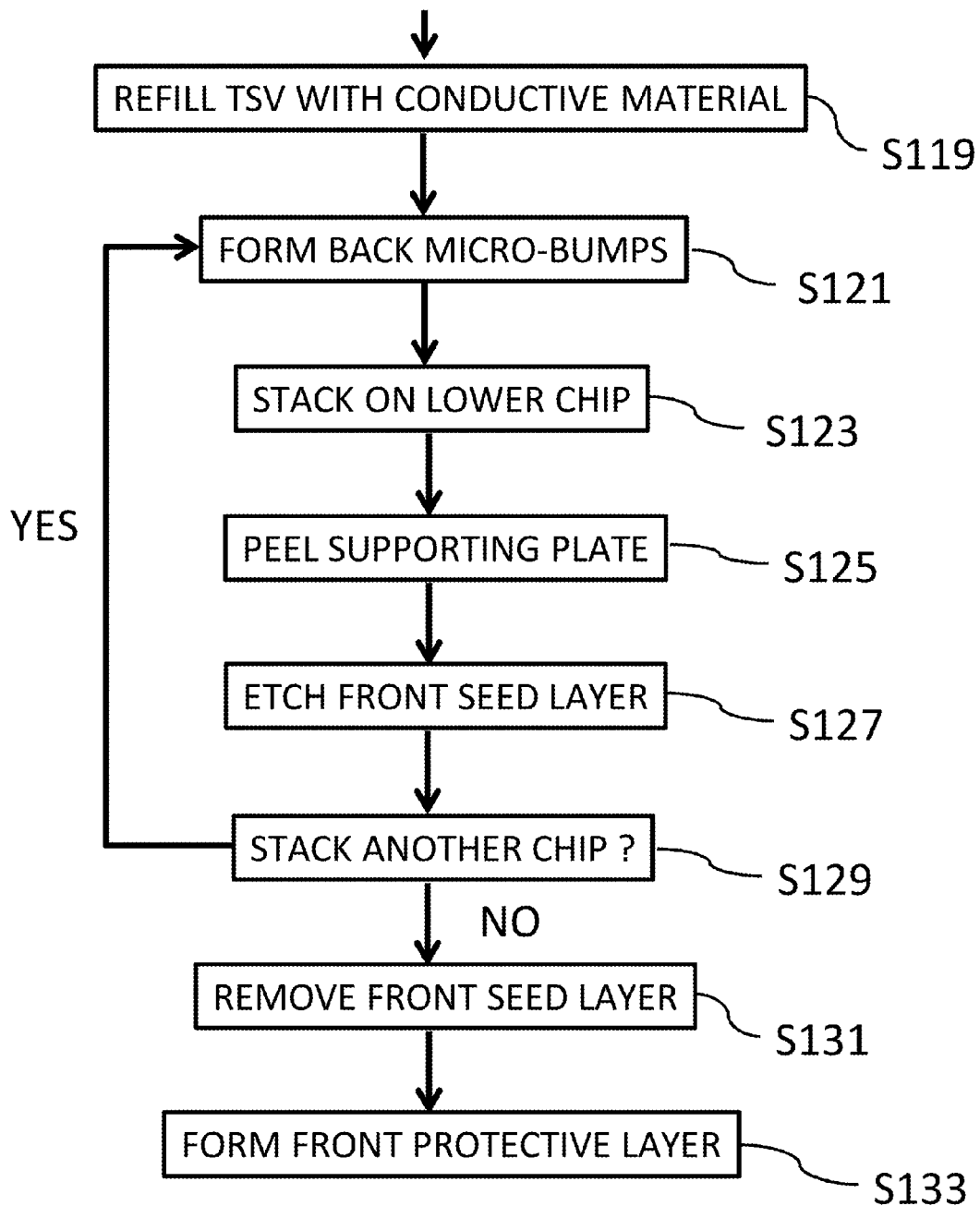

FIG. 3a and FIG. 3b are flow charts outlining a method for manufacturing process according to at least one example embodiment. FIG. 4a to FIG. 4i are cross sectional views that schematically outline a method for manufacturing process according to at least one example embodiment.

Referring to FIGS. 3a to 4i, a stacked semiconductor device manufacturing process flow chart is illustrated in two separate sheets of FIGS. 3a and 3b according to example embodiments. The stacked semiconductor device manufacturing process is also illustrated as cross sectional views of nine separate figures of FIGS. 4a through 4i.

In operations S101 and S103, active elements like MOS transistors (not shown in the figures) are formed on a silicon substrate 1, and a multi-wiring layer 2 is formed above the active elements.

In operation S105, as, an electrical conductor (or, alternatively, an electrically conductive means), a front seed layer 3 of compounds including gold (Au), tungsten (W) and titanium (Ti), or titanium (Ti) and copper (Cu) is formed by a chemical vapor deposition (CVD) or a target sputtering, for example.

In operation S107, a micro-bump pattern is formed by a resist coating and development, for example. A front bum layer including tin (Sn) and silver (Ag) is formed by electro-chemical plating, for example.

In operation S109, the resist micro-bump pattern is removed and micro-bumps 4 are formed on the seed layer 3.

Thereafter, in operation S111, without patterning and etching the seed layer 3, a supporting plate 5 is attached on the front side of the silicon substrate by an adhesive layer 6.

In operation S113, The back side of silicon substrate is thinned by chemical mechanical polishing (CMP) or other physical or chemical etching methods, for example.

Figure 4A:
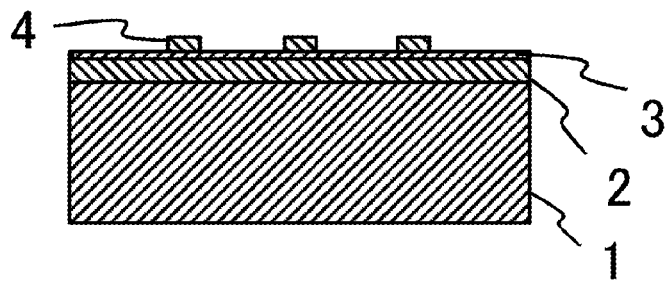
FIG. 4a to FIG. 4i are cross sectional views that schematically outline a method for manufacturing process according to at least one example embodiment.
Figure 4B:
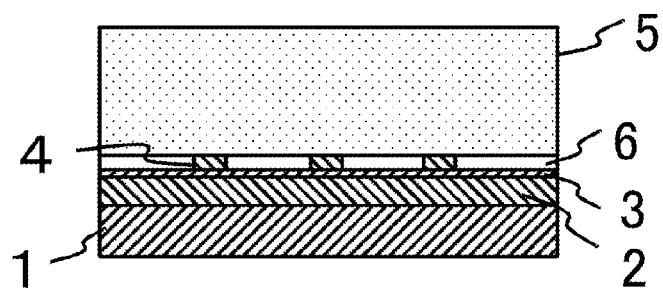
Figure 4C:
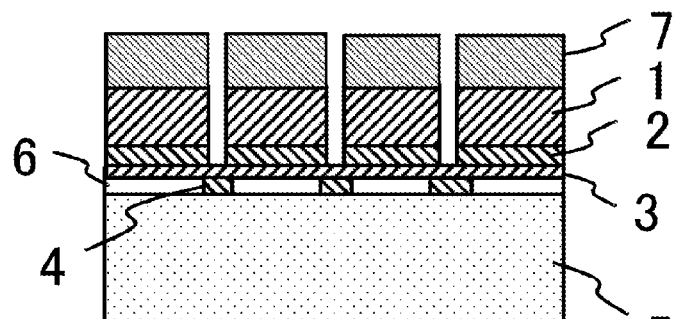
Figure 4D:
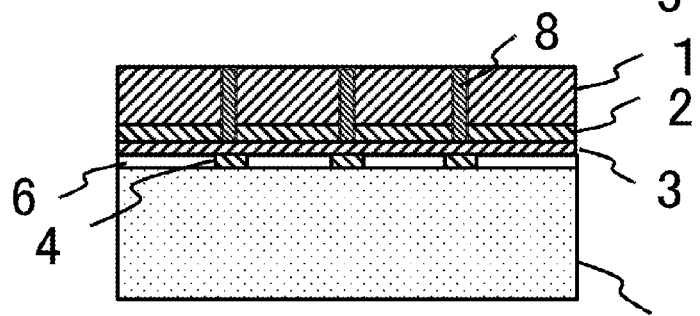

In operations S115 and S117, as illustrated in FIG. 4c, to form the through-silicon vias, a resist pattern 7 is formed on the backside of the thinned silicon substrate in order to form silicon trenches. The back side of the silicon is etched with the resist pattern mask by reactive ion etching (RIE) to form the through silicon via.

In operation S119, the resist 7 is removed, and non-conductive layers like CVD silicon dioxide (not shown in the figures), for example are formed on the side walls of the trenches. The trenches are plugged (for example, filled) with conductive materials like a metal alloy including copper (Cu), for example to form TSV structure 8 illustrated in FIG. 4d.

Figure 4E:
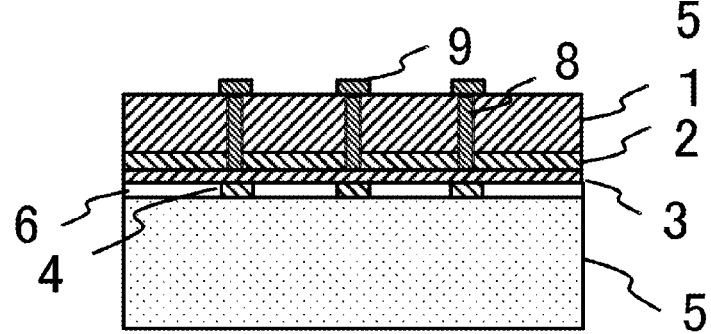

In operation S121, back side micro-bumps 9 including gold (Au) and nickel (Ni), for example, are formed on the refilled TSVs 8 as shown in FIG. 4e. Conductive materials as pads or seed layers (not shown in the figures) may be inserted between the back side micro-bumps 9 and the TSVs 8 in order to improve interface characteristics like ohmic contacts between the back side micro-bumps 9 and the TSVs 8.

As described above (FIG. 4a through FIG. 4e), a seed layer 3 covers silicon substrate 1 on which active elements are formed. With such a configuration and a manufacturing process thereof, ESD failures of the MOS input structure are prevented without input protection circuits under the harsh condition of high voltage or high frequency plasma, and mechanical or chemical polishing for TSV formation and wafer thinning, for example.

In operations S123 through S129, as illustrated in FIGS. 4f through 4i, chips may be stacked in a chip stacking process.

The first chip 101 is the interface chip which has solder bumps 10 on the back side micro-bumps 9 (not shown in this figure) of the backside of the first chip 101. Each input terminal, which is electrically connected with a solder bump 10, may have an input protection circuit. The input terminals on the front side of the first chip 101, in this case, may also have input protection circuits because the seed layer 3 is etched away except under the micro-bumps 4 before the upper inner chip 102 being stacked.

In operation S123, the second chip 102 is stacked on the first chip 101 such that the back side micro-bumps 9 on the second chip 102 contact with the micro-bumps 4 on the first chip.

Figure 4F:
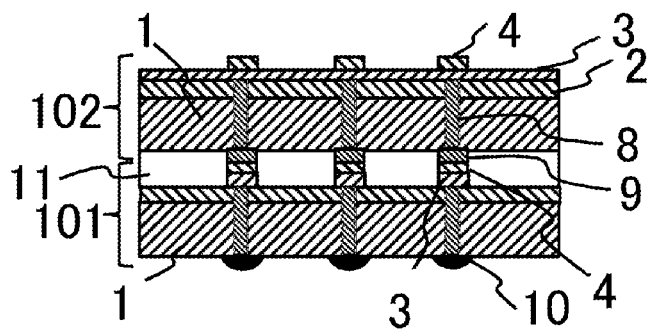

In operation S125, then the supporting plate 5 is peeled off as shown in FIG. 4f, where FIG. 4f illustrates the semiconductor device of FIG. 4e upside down.

Figure 4G:
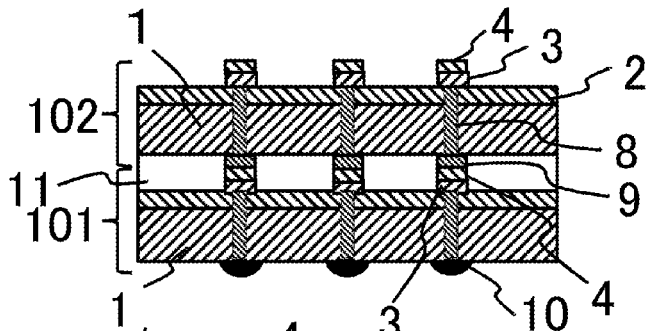

In operation S127, as shown in FIG. 4g, the seed layer 3, except the region under the micro-bumps 4, may be electrically separated by etching.

Similarly, in operation S129, the third chip 103 may be stacked on the second chip 102.

Figure 4H:
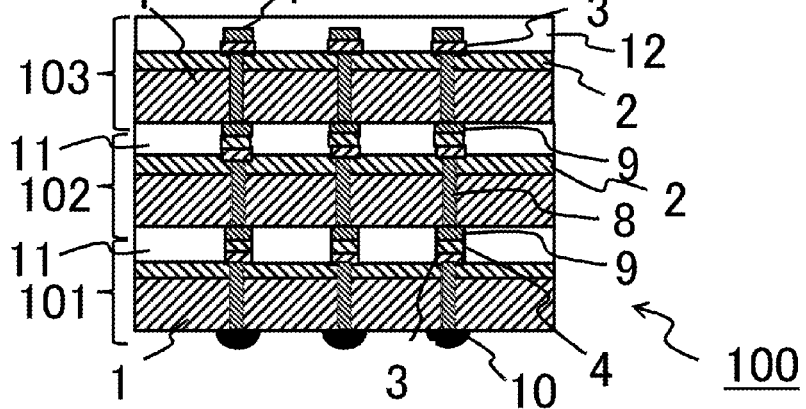

In operations S131 and S133, after stacking the top chip, the front seed layer 3 is removed and a protective layer 12 may be overlaid on the surface of the top chip so as to complete the final device 100, as shown in FIG. 4*h*.

In the figures, the third chip 103 may be the top chip, however example embodiments are not limited thereto. For example, a fourth, fifth or more chips can be stacked on successively.

Figure 4I:
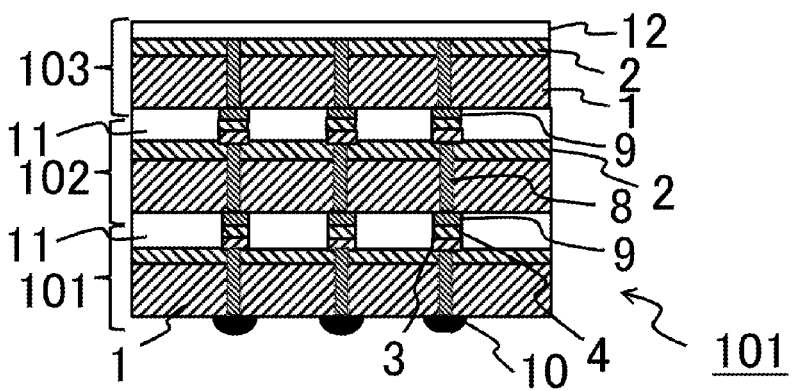

Regarding the top chip, the micro-bumps 4 may not be necessary to form on the seed layer 3 because another chip will not be stacked on the top chip any more. Therefore, the seed layer 3 on the top chip may be entirely etched away after the stacking process as shown in FIG. 4*i*.

Figure 5A:
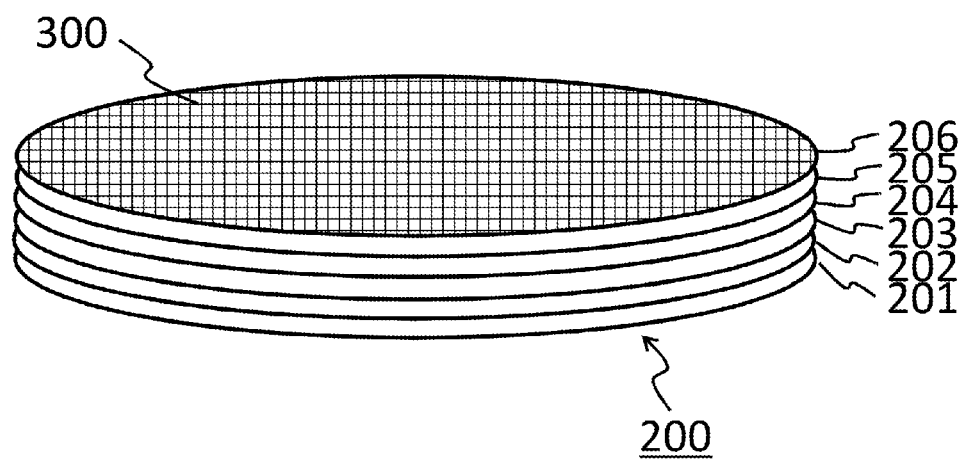
FIG. 5a is a cross sectional view that schematically illustrate a stacked DRAM obtained by a manufacturing method according to at least one example embodiment.

The above embodiment is applied not only to the diced semiconductor chips but also to the semiconductor wafers as shown in FIG. 5*a*.

Figure 5B:
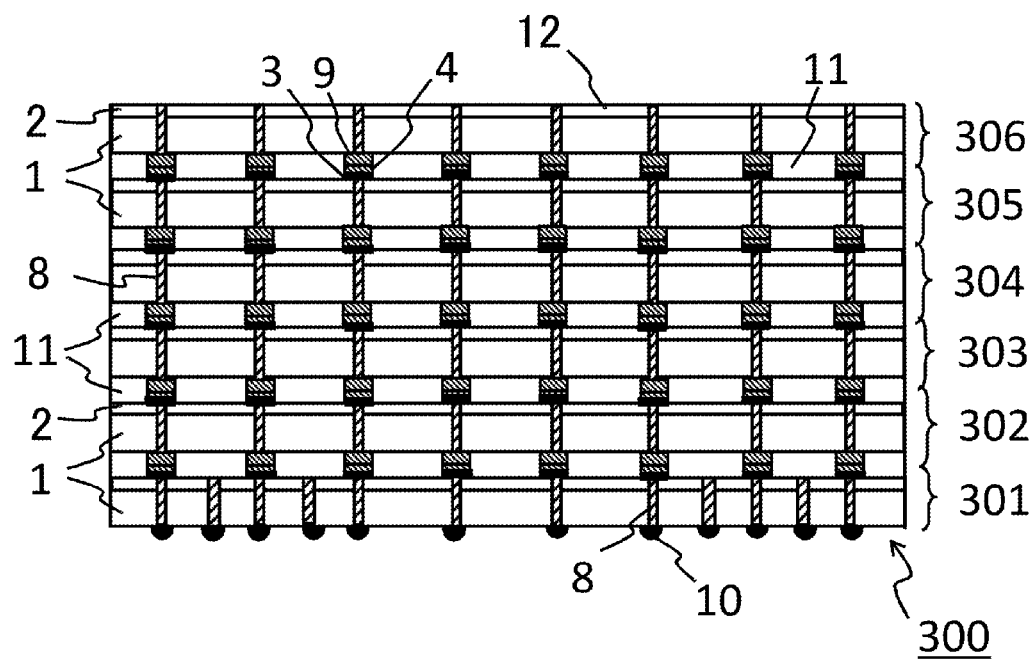
FIG. 5b is a perspective view that schematically illustrates a stacked DRAM wafers obtained by a manufacturing method according to at least one example embodiment.

FIG. 5*a* is a perspective view of stacked wafers 200. FIG. 5*b* is a cross-sectional view of a stacked device 300 obtained after dicing the stacked wafers 200.

Referring to FIGS. 5*a* and 5*b*, a plurality of wafers are stacked to form a stacked wafer 200. For example, a second wafer 202 is stacked on a first wafer 201. Similarly, third 203, fourth 204, fifth 205, and sixth 206, or more wafers are stacked successively.

Each of the wafers has an array of chips formed thereon. For example, as illustrated in FIG. 5*b*, arrays of first 301, second 302, third 303, fourth 304, fifth 305 and sixth 306 chips are formed on each of the wafers 201 to 206, respectively, shown in FIG. 5*a*.

The solder bumps 10, which may electrically contact with other devices, are formed on the backside of the first chip 301 formed on the bottom wafer 201. As explained above, each chip has the TSV structure 8, the seed layer 3, and the micro-bumps 4 and 9. After stacking all the wafers, each stacked device 300 is cut out from the stacked wafer 200.

The inner devices such as wafers from 202 to 206, and chips from 302 to 306 may be DRAMs, static random access memories, non-volatile memories, logic devices and various sensors, or these mixed devices, for example. The interface chip 301 may have some control circuits, memory elements, interface circuits, and input and output terminals having input and output buffers, respectively.

The stacked semiconductor device manufacturing method as described above effectively prevents ESD failures both during its manufacturing process and even after shipping or in the field. Input terminals on the interface chip, which may be exposed to external environment, may have input protection circuits against ESD. Input terminals of the inner chip may have much lower ESD risk because they may not be exposed to external environment. Therefore, input protection circuits may not be necessary to be integrated around the input terminals inner chips. Reducing the area of input protection circuits on inner chips, more circuits or memory cells could be integrated.

Figure 6A:
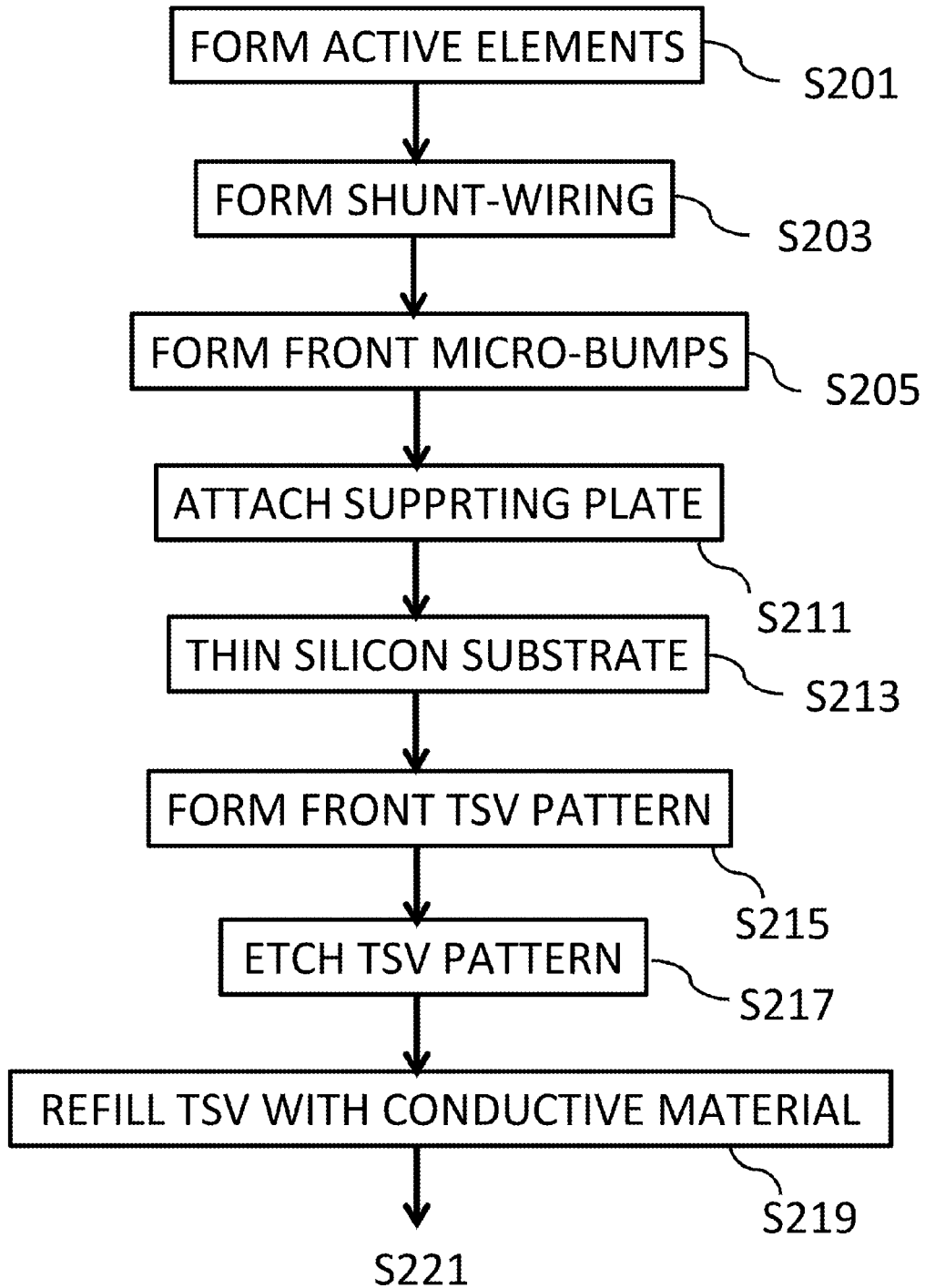
FIG. 6a and FIG. 6b are flow charts outlining a method for manufacturing process according to another example embodiment.
Figure 6B:
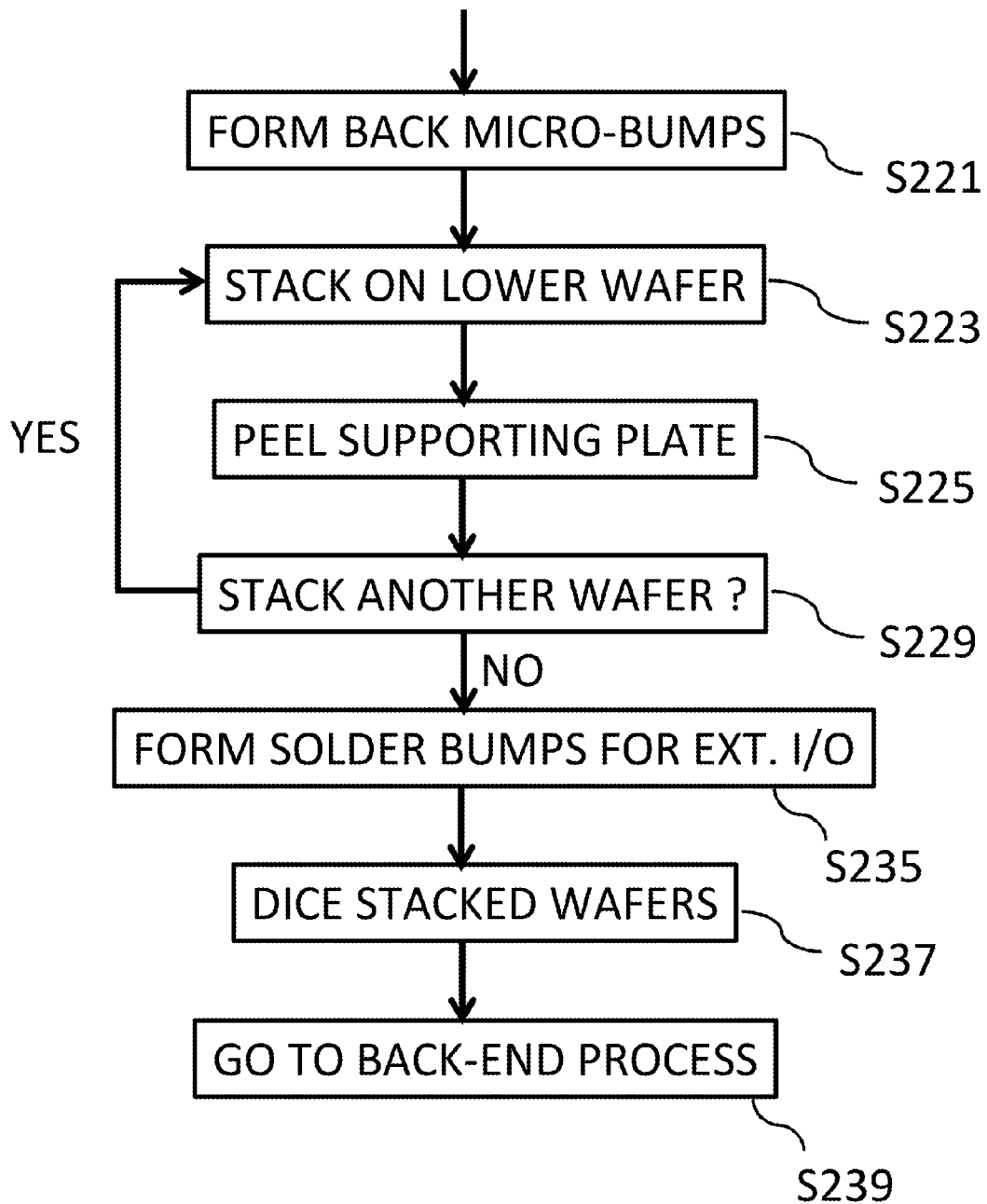

A stacked semiconductor device manufacturing process flow chart is illustrated in two separate sheets of FIGS. 6*a* and 6*b* according to example embodiments. The stacked semiconductor device manufacturing process is also illustrated as cross sectional views of nine separate figures from FIGS. 7*a* to 7*h*.

Referring to FIGS. 6*a* to 7*h*, in operation S201, active elements like MOS transistors (not shown in the figures) are formed on a silicon substrate 1.

In operation S203, multi-wiring layer 2 having a shunt-wiring pattern 13 is formed on the region where active elements are formed. As an electrical conductor (or, alternatively, an electrically conductive means), the shunt-wirings, which are formed by pattering the multi-wiring layers, may electrically connect input, output, power supply (VDD), and ground (GND) terminals to each other across the chips, for example.

A seed layer made of gold (Au), tungsten (W) and titanium (Ti) compound, or titanium (Ti) and copper (Cu) compound, for example, is formed by a plasma-sputtering on the multi-wiring layer 2.

Figure 7A:
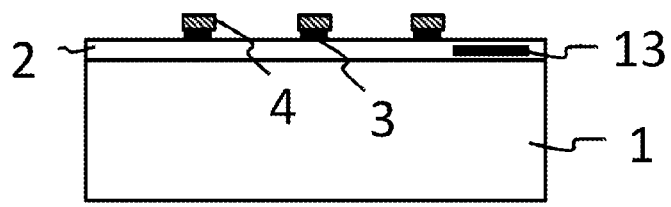

Thereafter, in operation S205, as illustrated in FIG. 7*a*, micro-bumps 4 including tin (Sn) and silver (Ag), for example, are formed on the seed layer 3 by electro and/or chemical plating followed by the micro-bump pattering. The front micro-bumps are formed by removing the seed layer 3, except under the micro-bumps 4, by plasma etching, for example.

In operation S211, a supporting plate 5 is attached on the front side of the silicon substrate by an adhesive layer 6.

Figure 7B:
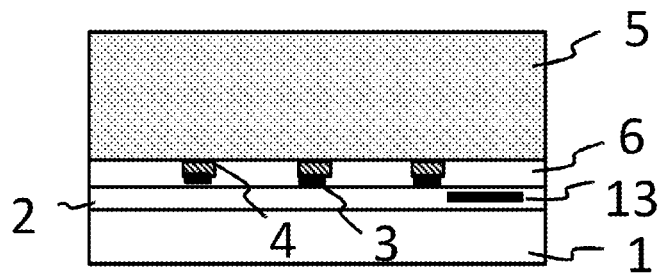

In operation S213, as illustrated in FIG. 7*b*, the back side of silicon substrate is thinned by chemical mechanical polishing (CMP) or other physical or chemical etching methods, for example.

In operation S215, on the backside of the thinned silicon substrate, a resist pattern 7 is formed in order to form silicon trenches.

Figure 7C:
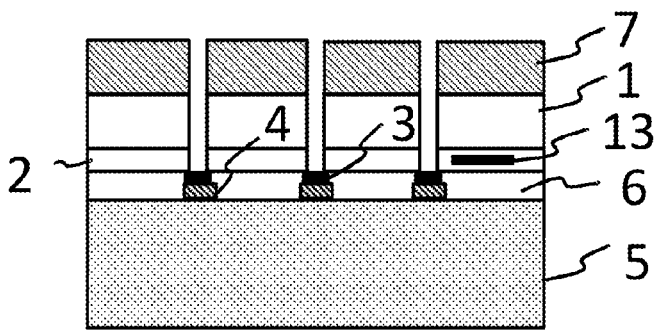

In operation S217, as illustrated in FIG. 7*c*, then the back side of the silicon is etched with the resist pattern mask 7 by a reactive ion etching (RIE) to form the through silicon via.

Figure 7D:
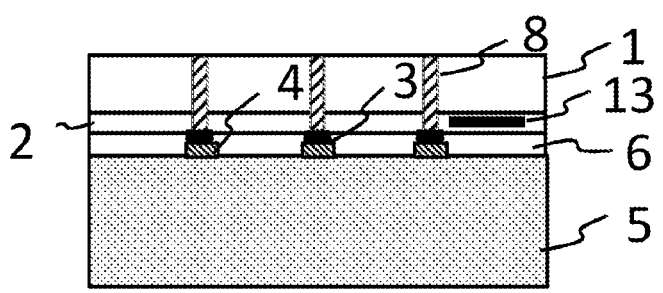

In operation S219, as illustrated in FIG. 7*d*, the resist 7 is removed, non-conductive layers like CVD silicon dioxide (not shown in the figures), for example are formed on the side walls of the trenches. The trenches are plugged (or, alternatively, filled) with conductive materials like a metal alloy including copper (Cu), for example to form TSV structure 8.

Figure 7E:
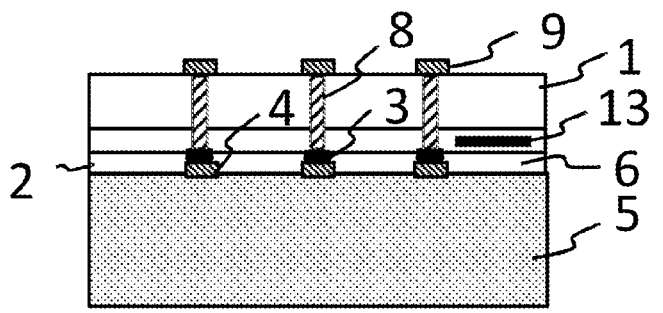

In operation S221, as illustrated in FIG. 7*e*, back side micro-bumps 9 including gold (Au) and nickel (Ni), for example are formed on the refilled TSVs 8. Conductive materials as pads or seed layers (not shown in the figures) may be inserted between the back side micro-bumps 9 and the TSVs 8 in order to improve interface characteristics like ohmic contacts between the back side micro-bumps 9 and the TSVs 8.

As described above (from FIGS. 7*a* to 7*e*), the shunt-wiring patterns 13 connect electrically at least input terminals of the MOS device with the power supply and the ground lines. With such a configuration and a manufacturing process thereof, ESD failures of the MOS input structure are reduced without input protection circuits under the harsh condition of high voltage or high frequency plasma, and mechanical or chemical polishing for TSV formation and wafer thinning, for example.

In operations S223 to S229, as illustrated in FIGS. 7*f* to 7*h*, the chips may be stacked in a chip stacking process.

The first chip 501 is the interface chip which has solder bumps 10 on the backside of the first chip 501. Each input terminal, which is electrically connected with a solder bump 10, may have an input protection circuit. The input terminals on the front side of the first chip may not have input protection circuits but may connect with the shunt wirings 13.

In operation S223, the second chip 502 may be stacked on the first chip 501 such that the back side micro-bumps 9 on the second chip 502 contact the micro-bumps 4 on the first chip.

In operation S223, as illustrated in FIG. 7*f*, then the supporting plate 5 is peeled off.

In operation S229, based on whether another chip is stacked, operations S223 and S225 may be repeated to stack another chip, for example, a third chip 503 on the second chip 502.

In operation S235, after stacking the top chip, a protective layer 12 may be overlaid on the surface of the top chip and the solder bumps 10 are formed on the backside of the first wafer 501.

In operation S237, then, the stacked wafers are diced as an electrically separating means, at the position indicating by the dashed line A-A' by a mechanical blade or a laser saw dicing machine, for example, so as to obtain the final device 500, as shown in FIGS. 7g and 7h.

In the figures, the third chip 503 may be the top chip, however, example embodiments are not limited thereto. For example, a fourth, fifth and more chips can be stacked on successively. Regarding the top chip, the seed layer 3 and the micro-bumps 4 may not be necessary to form on the front side of the chip because another chip will not be stacked on the top chip anymore, and the input terminals without input protection circuits are connected with the shunt-wiring 13 as shown in FIG. 7h.

The stacked semiconductor device manufacturing methods that are capable of manufacturing stacked semiconductor devices preventing from ESD failures even before the input terminals to be electrically connected with the output terminals of the facing chip to be stacked. Input protection circuits are not integrated around the input terminals, which may allow for an increased circuit or memory density because the reduction in the input protection circuits may increase a usable area on chip.

The input terminals on the interface chip 501, which connect with the output terminals on the upper chip 502, may not have input protection circuits. The input terminals connecting with solder bumps 10, which are exposed to the external environment, may have input protection circuits on the interface chip 501. With this configuration, the area for the input protection circuits on the interface chip can be reduced, and ESD failures may be prevented even before the chip stacking process and after the production completed.

Plane views of the shunt-wiring structure around the chip corners among the four chips are shown in FIGS. 8a, 8b and 8c according to the example embodiments.

Referring to FIGS. 8a to 8c, the shunt-wiring is made of low resistivity metal like aluminum (Al), copper (Cu), or their compound, for example, and formed using the shunt-wiring resist pattern during the same manufacturing process of a multi-wiring layer 2.

As shown in FIG. 8a, shunt-wirings 13 crossing the chip boarders or on the scribe area 14-1 electrically connect input and output terminals, ground (GND), and power supply terminals (VDD) on the TSV 8. With this shunt-wiring structure, all the terminals including the input terminals without input protection circuits are kept under the same electrical potential, which may prevent ESD failure even before the wafer dicing process. The shunt wiring 13 crossing the scribe area 14-1 may be cut by the wafer dicing saw, and, thus the shaded region along the scribe area 14-1, may be lost.

In FIG. 8b, the shunt-wiring 13 is patterned to bridge neighboring terminals and to cross the chip boundary 14-2 by patterning the shunt-wiring 13 in a single stroke or meander pattern. With this shunt-wiring pattern, the shunt wiring 13 may be cut and every terminal may be disconnected from each other even when a position of dicing saw shifts from the original scribe line 14-2.

The shunt-wiring structure shown in FIG. 8c includes multi-wiring layers. The shunt-wiring 13-1 is formed by patterning the nth metal layer (n is an integer equal or larger than one), for example. The shunt-wiring 13-2, on the other hand, is formed by patterning the n+1th metal layer, for example. In addition, two long horizontal and vertical parallel shunt wirings 13-1 and 13-2 are placed between the chips. The scribe lines 14-2 run just between these two long shunt-wirings. Each short shunt-wiring of 13-1, which is made of nth metal layer, for example, runs across the scribe line 14-2 and below the shunt-wiring 13-2. Each short shunt-wiring of 13-2, which is made of n+1th metal layer, for example, runs across the scribe line 14-2 and above the shunt-wiring 13-1. According to the example embodiment, the line space between the shunt wirings can be widened using multi-layer metal wirings, which may avoid short circuit troubles between the neighboring shunt wirings, and may be useful for semiconductor devices having an increased number of input and output terminals or the number of TSVs. Conventionally, increasing the number of terminals or shunt wirings, may cause electrical short-circuits due to metal residues or incomplete breaks of shunt wirings even after the wafer dicing process. In contrast, in one or more example embodiments, these risks can be decreased even when the actual dicing position is shifted from the desired (or, alternatively, the predetermined) scribe lines 14-2.

FIG. 9a shows a cross sectional view of another stacked semiconductor device 700 according to example embodiments.

Referring to FIG. 9a, semiconductor chips 701, 702, and 703 are stacked on an interposer 16, successively. The chips 701, 702, and 703 are, for example, a memory chip, a signal processing chip and a front side illuminated image sensor, respectively. Micro-lenses 15 are formed on the front side of the image sensor chip 703. The sensor driving circuits, input and output terminals (not shown in this figure), and a multi-wiring layer 2 are also formed on the front side of the image sensor chip 703. As explained above, the TSV structure is formed to have electrical contacts with the underneath chip 702.

It may be difficult to form a seed layer or micro-bumps on the top chip 703 because the micro-lenses 15 is formed on the top chip 703. The example embodiment of the manufacturing method explained above may be introduced as for the top chip 703. The input and output terminals, power supply (VDD) and the ground (GND) terminals, which are kept same potential level by shunt-wirings 13 before dicing, may be formed at the periphery of the front side of the top chip 703. This manufacturing method is capable of manufacturing stacked semiconductor devices with high production yields and high product reliability and higher circuit and memory density, and higher pixel numbers to be integrated on chip. This configuration may be useful for the stacked devices including different types of semiconductor chips.

FIG. 9b shows a cross sectional view of yet another stacked semiconductor device 800 according to example embodiments.

Referring to FIG. 9b, semiconductor chips 801, 802, and 803 are stacked on the interposer 16, successively. The chips 801, 802, and 803 are, for example, a memory chip, a signal processing chip and a back side illuminated image sensor (BSI), respectively. Micro-lenses 15 are formed on the back side of the top chip 803 because the top chip is a BSI. The sensor driving circuits, input and output terminals (not shown in this figure), and a multi-wiring layer 2 are formed on the front side of the image sensor chip 803 without the TSV structure. It may be difficult to form a seed layer on the top surface of the BSI because the micro-lenses 15 is formed on the BSI 803. As explained above, the shunt wirings 13 are formed on the top chip 803. The location or layout of the micro-bumps 4 of the top chip 803 is not limited to the chip peripheral region because the sensor driving circuits, input and output terminals (not shown in this figure), and a multi-wiring layer 2 are formed on the opposite side of the image sensing area, where no micro-lenses 15 are formed.

Stacked semiconductor device manufacturing process flow chart is illustrated in FIG. 10 regarding the stacked semiconductor devices as shown in FIGS. 9*a* and 9*b*, for example.

Referring to FIG. 10, on operation S401, the stacked semiconductor device manufacturing process flow of operations S101 to S131 disclosed in FIGS. 3*a* and 3*b* may be utilized to form the inner chips, such as memory devices and digital logic devices, for example, which may have highly integrated memory cells or logic circuits with a large number of input and output terminals.

In operation S402, the stacked semiconductor device manufacturing process flow of operations S201 to S221 disclosed in FIG. 6*a* may be utilized to form the top chip, on the other hand.

Next, in operations S322 and S325, the upper chip is stacked on the lower chip, and the supporting plate is removed thereafter.

In operations S335, S337 and S339, the solder bumps are formed on the backside of the bottom chip (S335), the stacked wafers are diced and the final back-end process is performed.

In the case of an image sensor, for example, in operation S334, micro-lenses are formed on the surface of the top chip prior to operation S335. As mentioned above, it may be difficult to form a seed layer or micro-bumps on the top surface of the top chip because the micro-lenses are formed without micro-bumps. With this configuration and manufacturing method, the seed layer and the micro-bump formation process on the surface of the top chip is not necessary, and thus can be eliminated.

Similarly, in operation S402, the stacked semiconductor device manufacturing process flow of operations S201 to S221, disclosed in FIG. 6*a*, may be utilized to form the bottom chip. The bottom chip may be exposed to external environment before stacking the upper chip. In addition, the seed layer on the bottom chip can't be etched away after the upper chip is stacked.

With this configuration and manufacturing method, input protection circuits around the input terminals on the front surface of the bottom chip can be eliminated. Even though input protection circuits are not integrated for the input terminals, which are connected with the output terminals on the upper chip, may be kept under stable electrical potential level even before the wafer stacking process or during the front-end process and protected against ESD. The fabrication methods as disclosed above may also enable higher circuit or memory density, and wider data or address bits of input and output terminals owing to the reduced input protection circuit area.

With fabrication methods according to example embodiments, different types of semiconductor devices like DRAM, SoC and sensing devices can be stacked, and the MOS transistor input gates on the chips may be protected against ESD with small form factors with higher production yields. Type of the TSV structure, micro-bump materials and process flows explained above may not be limited to the example embodiments disclosed above.

I claim:

1. A method of manufacturing a stacked semiconductor device including two or more wafers, the two or more wafers including at least an upper wafer and a lower wafer, the method comprising:
   forming active elements on the upper wafer;
   forming a conductor on a front side of the upper wafer, the conductor configured to electrically connect terminals including a ground and a power supply together with input terminals that have no input protection circuit, the input protection circuit being a circuit configured to absorb voltages resulting from electro-static discharge (ESD) events;
   forming front side micro-bumps on the front side of the upper wafer;
   forming a through silicon via (TSV) structure, the TSV structure configured to facilitate electrical connections between the front side and a back side of the upper wafer;
   forming back side micro-bumps on the back side of the upper wafer, the back side micro-bumps configured to electrically connect with the TSV structure and front side micro-bumps on a front side of the lower wafer;
   stacking the upper wafer on the lower wafer; and
   separating the conductor such that the input terminals are electrically independent from each other.

2. The method of claim 1, wherein
   the forming a conductor includes forming a seed layer on the upper wafer,
   the forming front side micro-bumps includes forming front side micro-bumps on the front side of the upper wafer before stacking the upper wafer on the lower wafer, and
   the separating includes etching the seed layer after stacking the upper wafer on the lower wafer.

3. The method of claim 1, wherein the forming conductor includes forming a shunt-wiring on the upper wafer, and the separating includes dicing the shunt-wiring after stacking the upper wafer on the lower wafer.

4. The method of claim 1, further comprising:
   forming a bottom wafer having interface chips and input terminals, which connect with output terminals on the upper chip, thereon without input protection circuits,
   the input protection circuits being circuits configured to absorb voltages resulting from ESD events.

5. The method of claim 3, wherein forming the shunt-wiring comprises: patterning a shunt-wiring pattern such that the shunt-wiring pattern has meandering pattern.

6. The method of claim 3, wherein the shunt-wiring has multi-layered structure.

7. The method of claim 1, wherein the forming a conductor includes forming a shunt-wiring on a top wafer of the two or more wafers such that a seed layer is not formed thereon.

8. The method of claim 7, further comprising: forming image sensor chips on the top wafer.

9. The method of claim 8, wherein an image sensor associated with the image sensor chips is back-side illuminated type image sensor.

10. The method of claim 4, further comprising:
   forming a shunt wiring on the bottom wafer having the interface chips formed thereon; and
   dicing the shunt wiring after stacking the upper wafer on the lower wafer.

* * * * *